(12) United States Patent
Sabathil et al.

(10) Patent No.: US 9,853,186 B2
(45) Date of Patent: Dec. 26, 2017

(54) PRODUCING A LIGHT-EMITTING SEMICONDUCTOR COMPONENT BY CONNECTING FIRST AND SECOND SEMICONDUCTOR BODIES

(71) Applicant: OSRAM Opto Semiconductors GmbH, Regensburg (DE)

(72) Inventors: Matthias Sabathil, Regensburg (DE);
Andreas Plößl, Regensburg (DE);
Hans-Jürgen Lugauer, Sinzing (DE);
Alexander Linkov, Regensburg (DE);
Patrick Rode, Regensburg (DE)

(73) Assignee: OSRAM OPTO SEMICONDUCTORS GMBH, Regensburg (DE)

( * ) Notice: Subject to any disclaimer, the term of this patent is extended or adjusted under 35 U.S.C. 154(b) by 6 days.

(21) Appl. No.: 15/144,728

(22) Filed: May 2, 2016

(65) Prior Publication Data

US 2016/0247966 A1    Aug. 25, 2016

Related U.S. Application Data

(62) Division of application No. 14/006,304, filed as application No. PCT/EP2012/053914 on Mar. 7, 2012, now Pat. No. 9,331,243.

(30) Foreign Application Priority Data

Mar. 23, 2011   (DE) .................. 10 2011 014 845

(51) Int. Cl.
*H01L 33/08* (2010.01)
*H01L 33/00* (2010.01)
(Continued)

(52) U.S. Cl.
CPC .......... *H01L 33/08* (2013.01); *H01L 33/0075* (2013.01); *H01L 33/0079* (2013.01);
(Continued)

(58) Field of Classification Search
CPC ......... H01L 33/32; H01L 33/22; H01L 33/06; H01L 33/502; H01L 33/0079
See application file for complete search history.

(56) References Cited

U.S. PATENT DOCUMENTS 5,543,648 A  *  8/1996  Miyawaki ......... H01L 21/02063
                                                        257/345
2006/0124917 A1    6/2006  Miller et al.
(Continued)

FOREIGN PATENT DOCUMENTS

CN    101268554 A    9/2008
CN    101897038 A    11/2010
(Continued)

OTHER PUBLICATIONS

Haase, M. et al., "II-IV Semiconductor Color Converters for Efficient Green, Yellow, and Red Light Emitting Diodes", Applied Physics Letters 96, 231116, 2010.
(Continued)

*Primary Examiner* — Benjamin Sandvik
*Assistant Examiner* — Farid Khan
(74) *Attorney, Agent, or Firm* — McDermott Will & Emery LLP (57) ABSTRACT

The invention relates to a light-emitting semiconductor component, comprising—a first semiconductor body (1), which comprises an active zone (11) in which during the operation of the light-emitting semiconductor component electromagnetic radiation is generated, at least some of which leaves the first semiconductor body (1) through a radiation exit surface (1*a*), and—a second semiconductor
(Continued)

body (2), which is suitable for converting the electromagnetic radiation into converted electromagnetic radiation having a longer wavelength, wherein—the first semiconductor body (1) and the second semiconductor body (2) are produced separately from each other,—the second semiconductor body (2) is electrically inactive, and—the second semiconductor body (2) is in direct contact with the radiation exit surface (1a) and is attached there to the first semiconductor body (1) without connecting means.

12 Claims, 4 Drawing Sheets (51) Int. Cl.
  H01L 33/50   (2010.01)
  H01L 33/26   (2010.01)
  H01L 33/06   (2010.01)
  H01L 33/22   (2010.01)
  H01L 33/32   (2010.01)

(52) U.S. Cl.
  CPC .............. *H01L 33/06* (2013.01); *H01L 33/22* (2013.01); *H01L 33/26* (2013.01); *H01L 33/32* (2013.01); *H01L 33/502* (2013.01); *H01L 33/504* (2013.01)

(56) References Cited

U.S. PATENT DOCUMENTS

| | | |
|---|---|---|
| 2006/0202105 A1 | 9/2006 | Krames et al. |
| 2006/0234461 A1* | 10/2006 | Nishihata .......... H01L 21/76254 438/365 |
| 2007/0126017 A1 | 6/2007 | Krames et al. |
| 2010/0200865 A1* | 8/2010 | Fujito .................. C30B 29/403 257/76 |
| 2010/0295057 A1* | 11/2010 | Sun ...................... H01L 27/156 257/76 |
| 2010/0295075 A1* | 11/2010 | Smith ................. H01L 25/0756 257/98 |
| 2011/0176305 A1* | 7/2011 | Schallmoser ............ F21K 9/00 362/235 |
| 2011/0256648 A1 | 10/2011 | Kelley et al. |
| 2012/0086034 A1* | 4/2012 | Yuan ..................... H01L 33/504 257/98 |
| 2013/0026527 A1* | 1/2013 | Ichikawa .............. H01L 33/501 257/98 |
| 2013/0187184 A1* | 7/2013 | Camras ............... H01L 25/0753 257/98 |

FOREIGN PATENT DOCUMENTS

| | | |
|---|---|---|
| CN | 101911318 A | 12/2010 |
| CN | 101933166 A | 12/2010 |
| EP | 0 486 052 A1 | 5/1992 |
| JP | H08264894 A | 10/1996 |
| JP | 2000277441 A | 10/2000 |
| JP | 2007-067418 A | 3/2007 |
| JP | 2011-507272 A | 3/2011 |
| JP | 2011-508450 A | 3/2011 |
| WO | WO-2007/034367 A1 | 3/2007 |
| WO | WO-2007023419 A1 | 3/2007 |
| WO | WO-2009064330 A2 | 5/2009 |
| WO | WO-2009/075972 A2 | 6/2009 |
| WO | WO-2009/085594 A2 | 7/2009 |
| WO | WO-2010/075177 A2 | 7/2010 |
| WO | WO-2010/123814 A1 | 10/2010 |

OTHER PUBLICATIONS

Murai, A. et al., "Wafer Bonding of GaN and ZnSSe for Optoelectronic Applications", Japanese Journal of Applied Physics, vol. 43, No. 10A, 2004, pp. L1275-L1277.

Plößl, A. et al., "Wafer direct bonding; tailing adhesion between brittle materials", Materials Science and Engineering, R25, 1999, pp. 1-88.

Yang, Z.H. et al., "Enhanced efficiency of CdMgZnSe down-converted light emitting diodes using light extraction features fabricated by laser-speckle lithography", Journal of Applied Physics 108, 123106, 2010 pp. 1-4.

* cited by examiner

PRODUCING A LIGHT-EMITTING SEMICONDUCTOR COMPONENT BY CONNECTING FIRST AND SECOND SEMICONDUCTOR BODIES

CROSS-REFERENCE TO RELATED APPLICATIONS

This present application is a divisional of U.S. patent application Ser. No. 14/006,304 filed Nov. 19, 2013, which is the National Phase of International Application No. PCT/EP12/53914 filed on Mar. 7, 2012, which claims the benefit of German Patent Application No. 102011014845.0, filed Mar. 23, 2011, all of which are hereby incorporated by reference in their entirety for all purposes.

DESCRIPTION

The document EP 0486052 A1 describes a light-emitting semiconductor component.

One object to be achieved consists in specifying a light-emitting semiconductor component having an improved efficiency of light generation.

In accordance with at least one embodiment of the light-emitting semiconductor component, the light-emitting semiconductor component comprises a first semiconductor body. The first semiconductor body is deposited for example epitaxially on to a growth carrier. The first semiconductor body is in this case based on a nitride compound semiconductor material, for example.

The first semiconductor body comprises at least one active zone, in which electromagnetic radiation is generated during the operation of the light-emitting semiconductor component. The electromagnetic radiation can be UV radiation and/or visible light, for example. The electromagnetic radiation generated in the at least one active zone leaves the first semiconductor body at least partly through a radiation exit area.

The radiation exit area is for example at least one part of a main area of the first semiconductor body. By way of example, the radiation exit area is formed by that outer area of the semiconductor body which is arranged in a manner facing away from a connection carrier or a circuit board on which the light-emitting semiconductor component is mounted. By way of example, the first semiconductor body is a light-emitting diode.

In accordance with at least one embodiment of the light-emitting semiconductor component, the light-emitting semiconductor component comprises a second semiconductor body, which is suitable for converting the electromagnetic radiation generated in the at least one active zone of the first semiconductor body. In this case, the electromagnetic radiation which leaves the first semiconductor body through the radiation exit area is at least partly converted into electromagnetic radiation having a longer wavelength. That is to say that the second semiconductor body is suitable for so-called "down-conversion". By way of example, the second semiconductor body acts as a converter on account of its natural band gap. However, it is also possible for the second semiconductor body to comprise at least one pn junction, at least one quantum well structure or at least one multi quantum well structure which is optically pumped by the electromagnetic radiation generated in the first semiconductor body.

The second semiconductor body can also be produced for example by means of epitaxial growth of the second semiconductor body on to a growth carrier.

In accordance with at least one embodiment of the light-emitting semiconductor component, first semiconductor body and second semiconductor body are produced separately from one another. That is to say that the second semiconductor body is, in particular, not grown epitaxially on to the radiation exit area of the first semiconductor body. Rather, the first semiconductor body and the second semiconductor body can be produced separately from one another, for example epitaxially, and subsequently be connected to one another. The feature according to which the first semiconductor body and the second semiconductor body are produced separately from one another is a feature which defines a subject and which is detectable on the finished light-emitting semiconductor component. That is to say that the light-emitting semiconductor component can be unambiguously distinguished from a light-emitting semiconductor component in which the second semiconductor body is grown epitaxially on the first semiconductor body.

In accordance with at least one embodiment of the light-emitting semiconductor component, the second semiconductor body is electrically inactive. That is to say that the generation of the converted electromagnetic radiation in the second semiconductor body is not effected on the basis of electrical pumping of the second semiconductor body, rather the second semiconductor body is optically pumped by the electromagnetic radiation generated by the first semiconductor body during operation. The light-emitting semiconductor component is therefore for example free of electrical connections by means of which the second semiconductor body is contact-connected.

In accordance with at least one embodiment of the light-emitting semiconductor component, the second semiconductor body and the first semiconductor body are in direct contact with one another. That is to say that the second semiconductor body is situated for example in direct contact with the radiation exit area of the first semiconductor body and is fixed to the first semiconductor body there in a manner free of connecting means.

"In a manner free of connecting means" means that no connecting means such as, for example, an adhesive or a so-called "index matching gel" is arranged between first semiconductor body and second semiconductor body. The adhesion between first semiconductor body and second semiconductor body is imparted in particular by hydrogen bridges and/or van der Waals interaction in the region of the interface between first semiconductor body and second semiconductor body. In other words, first semiconductor body and second semiconductor body are fixed to one another by means of so-called "direct bonding".

The connection between first semiconductor body and second semiconductor body is mechanically stable. If appropriate, it is possible that the connection cannot be released non-destructively. That is to say that in the event of the connection being released, at least one of the two semiconductor bodies would be damaged or destroyed. This is the case, for example, if the connection is a strong chemical bond or a primary chemical bond.

In accordance with at least one embodiment of the light-emitting semiconductor component, the light-emitting semiconductor component comprises a first semiconductor body, which comprises an active zone, in which electromagnetic radiation is generated during the operation of the light-emitting semiconductor component. The electromagnetic radiation generated in the first semiconductor body passes at least partly through a radiation exit area. The light-emitting semiconductor component furthermore comprises a second semiconductor body, which is suitable for converting the electromagnetic radiation into converted electromagnetic radiation having a longer wavelength. In the case of a light-emitting semiconductor component of this embodiment, first semiconductor body and second semiconductor body are produced separately from one another, the second semiconductor body is electrically inactive and the second semiconductor body is in direct contact with the radiation exit area and is fixed to the first semiconductor body there in a manner free of connecting means.

In the case of the present light-emitting semiconductor component, it is possible, in particular, that there is no intermediate layer present which imparts the optical, thermal and mechanical connection between the pump source, that is to say the first semiconductor body, and the converter, that is to say the second semiconductor body. Rather, the converter is applied directly to the pump source in such a way that a chemical bond between the converter and the radiation exit area of the pump source arises as a result. This makes it possible to significantly improve the coupling-in of light into the converter and the thermal link between converter and pump source. In this way, the light-emitting semiconductor component is suitable for highly efficient conversion and thus for generation of polychromatic or monochromatic light. The high efficiency arises, in particular, as a result of a minimization of Stokes losses, converter overheating and coupling-in and/or coupling-out losses.

In the present case, the second semiconductor body is used as converter. Since a semiconductor body has a high absorption constant, the semiconductor body can be made very thin. The light-emitting semiconductor component described here is therefore also distinguished by a particularly small structural height and is therefore particularly well suited to the direct backlighting of imaging elements such as LCD panels, for example.

The bonding between first semiconductor body and second semiconductor body can be covalent or ionic. The dissipation of the heat loss from the second semiconductor body through the first semiconductor body is minimized by a minimization of the thermal resistances between first semiconductor body and second semiconductor body. The direct coupling by strong chemical bonds between first semiconductor body and second semiconductor body maximizes the heat transfer from the second semiconductor body to the first semiconductor body. Since the first semiconductor body can be linked to a heat sink, for example, the heat loss produced during the conversion can be optimally dissipated from the second semiconductor body.

In this case, the direct connection between first semiconductor body and second semiconductor body can even be effected at room temperature, thereby ensuring that the strains in the case of first and second semiconductor bodies which are not thermally matched to one another do not lead to layer damage.

Furthermore, the use of a second semiconductor body as converter makes it possible to use converters which have substantially the same optical refractive index as the first semiconductor body. Therefore, the conversion takes place highly efficiently by direct coupling of the electromagnetic radiation into the converter without intervening, lossy connecting means layers having no conversion effect.

The second semiconductor body as converter furthermore preferably has a significantly lower full width at half maximum than conventional, for example ceramic, converters, which can bring about, inter alia, lower Stokes losses. Therefore, for example a higher conversion efficiency is possible for the generation of warm-white light, since, in particular, the thus required conversion from blue light to red light can be effected in a very narrowband fashion. The generally very lossy long-wave portion of the converted light is thus minimized.

On account of the improved heat dissipation, the light-emitting semiconductor component described here can furthermore be suitable for high currents, since thermally poorly conductive matrix materials in which conversion materials are usually arranged are obviated.

In this case, the light-emitting semiconductor component described here can generate colored light, such as, for example, green, yellow or red light, during operation. Furthermore, it is possible for the light-emitting semiconductor component to generate white light during operation.

The first semiconductor body and the second semiconductor body can for example already be connected to one another at the wafer level, such that the simultaneous production of a multiplicity of light-emitting semiconductor components is possible.

Furthermore, coupling-out of light or electromagnetic radiation from the second semiconductor body can be maximized by, for example, roughening the outer area of the second semiconductor body facing away from the first semiconductor body.

In accordance with at least one embodiment of the light-emitting semiconductor component, the radiation exit area and the outer area of the second semiconductor body facing the radiation exit area in each case have a root-mean-square roughness value of at most 2 nm, in particular less than or equal to 1 nm, preferably less than or equal to 0.5 nm. In this case, the root-mean-square roughness value Rq is the root-mean-square value of all profile values of the roughness profile. In this case, the designation RMS is also used for the root-mean-square roughness value. In the present case, the two outer areas of the first semiconductor body and of the second semiconductor body at which the first semiconductor body and the second semiconductor body are connected to one another are therefore made particularly smooth. Preferably, the root-mean-square roughness value of at least one of the two facing surfaces is significantly less than 0.5 nm, for example 0.2 nm or less.

In accordance with at least one embodiment of the light-emitting semiconductor component, the first semiconductor body is based on a nitride compound semiconductor material. In the present context, "based on nitride compound semiconductor material" means that the semiconductor layer sequence or at least one part thereof, particularly preferably at least the active zone and/or the growth substrate wafer, comprises or consists of a nitride compound semiconductor material, preferably $Al_nGa_mIn_{1-n-m}N$, where $0 \leq n \leq 1$, $0 \leq m \leq 1$ and $n+m \leq 1$. In this case, this material need not necessarily have a mathematically exact composition according to the above formula. Rather, it can comprise for example one or more dopants and additional constituents. For the sake of simplicity, however, the above formula includes only the essential constituents of the crystal lattice (Al, Ga, In, N) even if these can be replaced and/or supplemented in part by small amounts of further substances. In this case, the first semiconductor body is produced epitaxially, for example, the growth substrate being removed from the first semiconductor body.

In this case, the first semiconductor body can be electrically contact-connected for example from the side facing away from the second semiconductor body. Furthermore, it is possible for at least one contact for connecting the first semiconductor body to be arranged between the first semiconductor body and the second semiconductor body or for the second semiconductor body to have at least one cutout in which the at least one contact is arranged on the outer area of the first semiconductor body facing the second semiconductor body.

In accordance with at least one embodiment of the light-emitting semiconductor component, the second semiconductor body is based on a II-VI compound semiconductor material. A II/VI compound semiconductor material comprises at least one element from the second main group or the second subgroup, such as, for example, Be, Mg, Ca, Sr, Zn, Cd, or Hg, and an element from the sixth main group, such as, for example, O, S, Se, Te. In particular, a II/VI compound semiconductor material comprises a binary, ternary or quaternary compound comprising at least one element from the second main group and at least one element from the sixth main group. Such a binary, ternary or quaternary compound can additionally comprise for example one or a plurality of dopants and additional constituents. By way of example, the II/VI compound semiconductor materials include: ZnO, ZnMgO, CdS, ZnCdS, MgBeO.

The material for the second semiconductor body can be for example the material system (ZnCdMg) (SSe). This material system is distinguished by a very high radiant efficiency. Furthermore, a second semiconductor body composed of this material can be deposited epitaxially with atomically smooth surfaces on to a growth substrate. A converter based on this material system is described for example in the document Appl. Phys. Lett. 96, 231116, 2010. This document is hereby expressly incorporated by reference.

In accordance with at least one embodiment of the light-emitting semiconductor component, the second semiconductor body is based on a III-V compound semiconductor material. By way of example, the second semiconductor body is based on the material system (AlGaIn) (NAsP).

A second semiconductor body composed of this material system is also distinguished by a high radiant efficiency and can be deposited epitaxially with automatically smooth surfaces over a large area on a growth carrier, for example composed of GaAs or InP.

In accordance with at least one embodiment of the light-emitting semiconductor component, the second semiconductor body has a thickness of at most 6 µm, in particular at most 3 µm, preferably at most 1.5 µm. Such a small thickness is possible in particular on account of the high absorption constants of semiconductor conversion layers. In this way, the structural height of the finished light-emitting semiconductor component can turn out to be very small, since the second semiconductor body scarcely increases said structural height.

Furthermore, a method for producing a light-emitting semiconductor component is specified. Preferably, a light-emitting semiconductor component described here can be produced by means of the method. That is to say that all features described for the light-emitting semiconductor component are also disclosed for the method, and vice versa.

In accordance with at least one embodiment of the method, one method step involves depositing the first semiconductor body epitaxially on to a growth area of a growth carrier, said growth area being formed with silicon. By way of example, the growth carrier can in this case consist of silicon. However, it is also possible for the growth carrier to comprise a layer composed of silicon, wherein an outer area of said layer forms the growth area.

In accordance with a further method step, the growth carrier is stripped away from the first semiconductor body by means of etching. That is to say that the growth carrier is stripped away wet-chemically, in particular. The very good polishing quality of silicon surfaces is utilized in this case. After the wet-chemical stripping away of the growth carrier, that is to say in particular of the silicon surface, from the first semiconductor body, the outer area of the first semiconductor body originally facing the growth carrier can be used directly for connection to the second semiconductor body, since said outer area of the first semiconductor body should be regarded as a replica of the very smooth silicon surface. That is to say that the atomically smooth silicon surface is transferred by means of the method to the outer area of the first semiconductor body, which is then available for joining the first and the second semiconductor body.

In a further method step, the first semiconductor body is connected to the second semiconductor body at its outer area which originally faces the growth area and which comprises the radiation exit area.

In the case of the method, therefore, without further method steps for treating the outer area of the first semiconductor body, it is possible for the radiation exit area to have a root-mean-square roughness value of at most 2 nm, in particular at most 1 nm, preferably at most 0.5 nm. For this purpose, the growth area of the growth carrier preferably itself has a root-mean-square roughness value of at most 2 nm, in particular at most 1 nm, preferably at most 0.5 nm, which is transferred to the outer area of the first semiconductor body.

In accordance with at least one embodiment of the method, the second semiconductor body is deposited epitaxially on to a growth carrier by means of molecular beam epitaxy (MBE) and is connected to the first semiconductor body by its outer area facing away from the growth carrier. In this case, the growth carrier for the second semiconductor body can be for example a growth carrier having a growth area composed of GaAs, Ge or InP. By way of example, the growth carrier is formed with one of said materials. Smooth outer areas can be produced during the molecular beam epitaxy. Furthermore, it is possible for the outer area to be smoothed by polishing or chemical polishing, for example, before the two semiconductor bodies are joined.

In accordance with at least one embodiment of the method, the growth carrier for the second semiconductor body has a root-mean-square roughness value of at most 2 nm, in particular at most 1 nm, preferably at most 0.5 nm at its outer area facing the second semiconductor body. The growth carrier is stripped away from the second semiconductor body after the second semiconductor body has been deposited, and the second semiconductor body is connected to the first semiconductor body by its outer area facing the growth carrier. In this case, for example, the very good polishing quality of a growth area composed of GaAs, Ge or InP can be used.

The clean surface required for joining the first and second semiconductor bodies can be produced in situ, that is to say for example in the epitaxy reactor.

By way of example, adsorbate and contamination layers on the surfaces intended for joining can be atomized by sputtering or ion bombardment, in particular using argon ions. Furthermore, cleaning by thermal desorption and/or by UV-induced desorption is possible. In order to protect the surfaces activated by means of the cleaning step against repassivation, the joining between the first semiconductor body and the second semiconductor body is preferably effected in an inert atmosphere or in a vacuum, in particular in an ultrahigh vacuum.

In addition, a mesa etching or texturing of the outer area of the second semiconductor body facing away from the first semiconductor body can also be effected, which leads to an improved coupling-out efficiency.

The light-emitting semiconductor component described here and also the method described here are explained below on the basis of exemplary embodiments with associated figures.

Elements that are identical, of identical type or act identically are provided with the same reference signs in the figures. The figures and the size relationships of the elements illustrated in the figures among one another should not be regarded as to scale. Rather, individual elements may be illustrated with an exaggerated size in order to enable better illustration and/or in order to afford a better understanding.

The schematic sectional illustrations in FIGS. 1A to 1G show different method steps of a method described here.

Figure 1A:
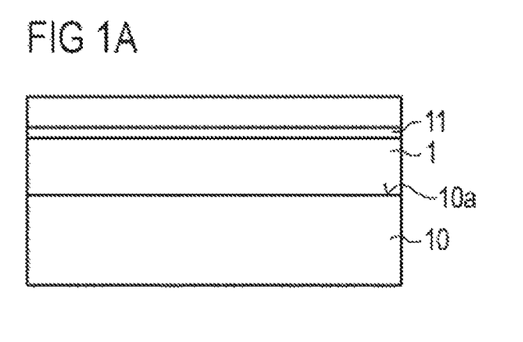

A first method step of a method described here is explained in greater detail in conjunction with the schematic sectional illustration in FIG. 1A. In this first method step, a first semiconductor body 1 is deposited epitaxially on to the growth area 10a of a growth carrier 10. The first semiconductor body 1 is based on a nitride compound semiconductor material, in particular on an indium-containing nitride compound semiconductor material.

The growth carrier 10 comprises a growth area 10a formed with silicon. That is to say that the first semiconductor body 1 is deposited epitaxially on to a silicon surface. The growth area 10a is distinguished by its smooth surface and has a root-mean-square roughness value of at most 2 nm, in particular at most 1 nm, preferably at most 0.5 nm.

During the operation of the light-emitting semiconductor component to be produced, the active zone 11 is suitable for generating electromagnetic radiation in the spectral range between UV radiation and blue light.

Figure 1B:
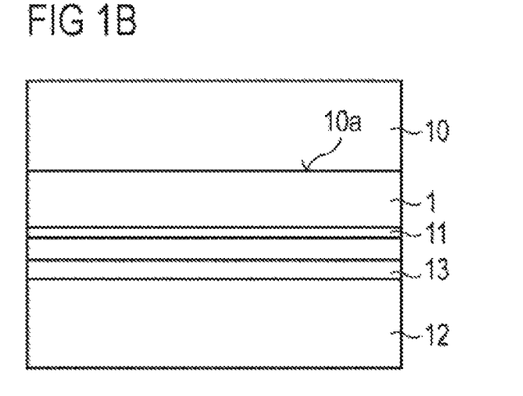

In a subsequent method step, see FIG. 1B, the semiconductor body 1 is applied, by its side facing away from the growth carrier 10, to a carrier 12 and fixed there for example by the connecting means 13, for example a solder. The carrier 12 can be for example a metallic, ceramic or semiconducting carrier. By way of example, the carrier 12 is formed with copper, a ceramic material such as aluminum oxide or a semiconducting material such as germanium. Furthermore, the carrier 12 can also be a connection carrier such as a circuit board.

Figure 1C:
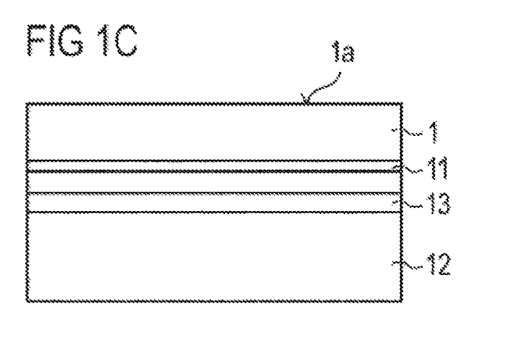

In the next method step, FIG. 1C, the growth carrier 10 is stripped away from the semiconductor body 1. The stripping-away is preferably effected wet-chemically by means of etching. The topography of the very smooth growth area 10a is transferred, in a manner governed by this method, to the outer area of the first semiconductor body 1 facing away from the carrier 12. Said outer area later forms the radiation exit area 1a of the semiconductor body 1.

Figure 1D:
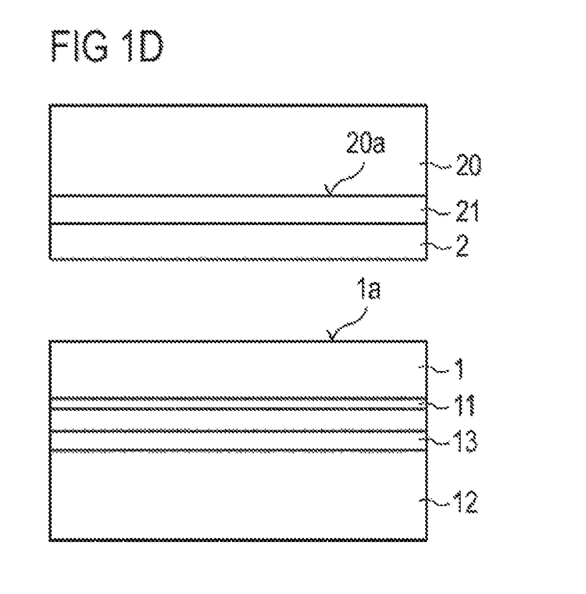

In the next method step, in addition to the semiconductor body 1 prepared in this way, a second semiconductor body 2 is provided. The second semiconductor body 2 is applied for example epitaxially to the growth area 20a of a growth carrier 20. The growth carrier 20 is for example a substrate having a growth area 20a formed with GaAs, Ge or InP. The second semiconductor body 2 is grown by means of MBE, for example. The outer area of the second semiconductor body 2 facing away from the growth carrier 20 is therefore made very smooth and has a root-mean-square roughness value of at most 0.5 nm.

Optionally, an intermediate layer 21 can be arranged between the growth carrier 20 and the second semiconductor body 2, said intermediate layer serving for example as an etching stop layer or sacrificial layer and likewise being produced epitaxially.

Furthermore, it is possible that, in this method step, cleaning and thus passivation of the exposed outer areas of the first semiconductor body 1 and second semiconductor body 2 take place under a protective atmosphere or in a vacuum.

Figure 1E:
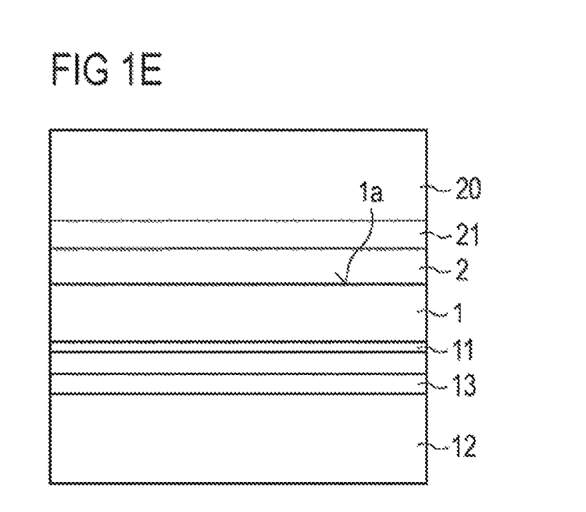

A joining step is described in conjunction with FIG. 1E, in which joining step the first semiconductor body 1 and the second semiconductor body 2 are mechanically fixedly connected to one another. In this case, the second semiconductor body 2 is in direct contact with the radiation exit area 1a of the first semiconductor body 1 and the connection between the two semiconductor bodies is free of connecting means, for example imparted by ionic forces or van der Waals interaction.

Figure 1F:
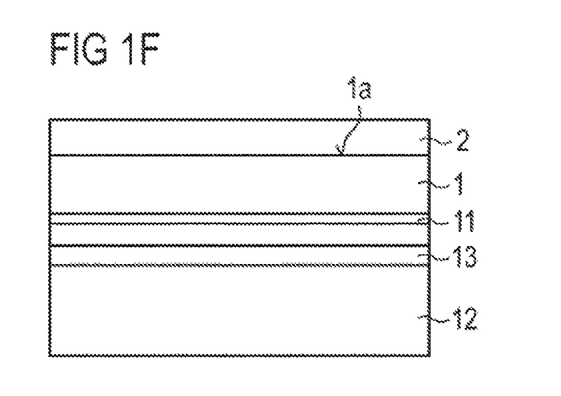

In a further method step, FIG. 1F, the growth carrier 20 and if appropriate the intermediate layer 21 are stripped away from the second semiconductor body 2. Roughening of the outer area of the second semiconductor body 2 facing away from the first semiconductor body 1 to form a roughened surface 2a can be effected during this stripping-away or afterward, see FIG. 1G. As a result of this structuring, the later light-emitting semiconductor component has an improved light coupling-out coefficient.

Figure 1G:
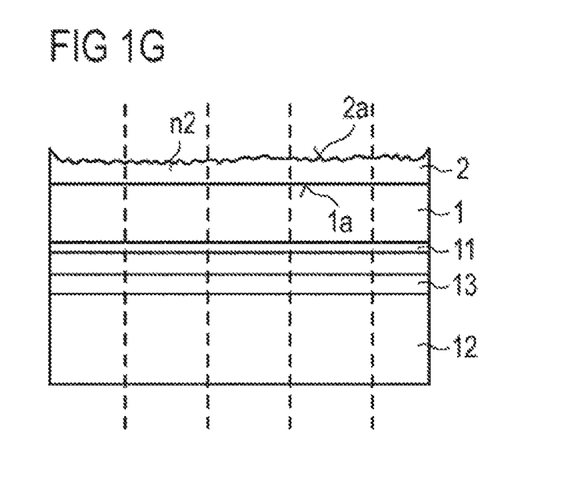
FIG. 1G shows a schematic sectional illustration of a multiplicity of light-emitting semiconductor components described here.

A subsequent method step involves singulation along the dashed lines into individual light-emitting semiconductor components. Contact-connection (not shown) can be effected from the side of the carrier 12 or from the side of the second semiconductor body 2.

Figure 2:
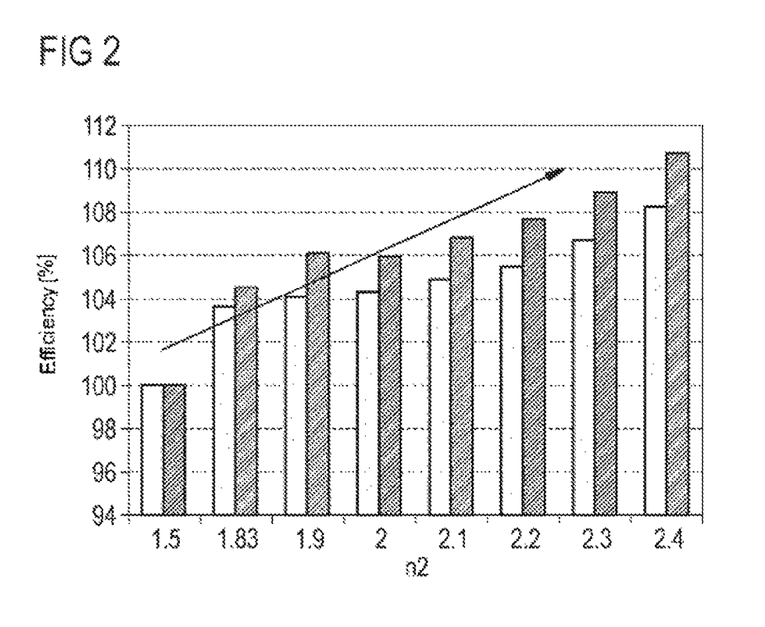
FIG. 2 shows a schematic graphical illustration for elucidating the invention.

A light-emitting semiconductor component produced in this way is distinguished, inter alia, by the fact that the jump in refractive index between first semiconductor body 1 and second semiconductor body 2 can be chosen to be relatively small. This leads to an increased efficiency of the component. Assuming that the refractive index of the first semiconductor body is 2.4 and the light-emitting semiconductor component is encapsulated in silicone, which has a refractive index of 1.5, the relative efficiency is plotted graphically in FIG. 2 for different values of the refractive index n2 of the second semiconductor body 2. The right-hand part of the columns here in each case shows the efficiency for a light-emitting semiconductor component which emits warm-white light, and the left-hand part of the column shows the efficiency for a cold-white semiconductor component. As can be gathered from FIG. 2, the efficiency rises as the refractive index n2 of the second semiconductor body 2 increases. For example for a second semiconductor body formed with ZnCdMgSe, this results in n2=2.4 and an increase in efficiency of between 8 and 10%, depending on whether cold-white or warm-white light is intended to be generated.

The invention is not restricted to the exemplary embodiments by the description on the basis of said exemplary embodiments. Rather, the invention encompasses any novel feature and also any combination of features, which in particular includes any combination of features in the patent claims, even if this feature or this combination itself is not explicitly specified in the patent claims or exemplary embodiments.

What is claimed is:

1. A light-emitting semiconductor component comprising:
 a first semiconductor body, which comprises an active zone, in which electromagnetic radiation is generated during the operation of the light-emitting semiconductor component, said electromagnetic radiation leaving the first semiconductor body at least partly through a radiation exit area; and a second semiconductor body, which is suitable for converting the electromagnetic radiation into converted electromagnetic radiation having a longer wavelength, wherein the second semiconductor body is electrically inactive, wherein the second semiconductor body is in direct contact with the radiation exit area and is fixed to the first semiconductor body there, in a manner free of connecting means, wherein the radiation exit area and the outer area of the second semiconductor body facing the radiation exit area in each case have a root-mean-square roughness value of at most 2 nm, and wherein the second semiconductor body is based on a III-V compound semiconductor material.

2. The light-emitting semiconductor component according to claim 1, wherein the radiation exit area and the outer area of the second semiconductor body facing the radiation exit area in each case have a root-mean-square roughness value of at most 0.2 nm.

3. The light-emitting semiconductor component according to claim 1, wherein the first semiconductor body is based on a nitride compound semiconductor material.

4. The light-emitting semiconductor component according to claim 1, wherein the first semiconductor body is electrically contact-connected exclusively from a side of the first semiconductor body facing away from the second semiconductor body.

5. The light-emitting semiconductor component according to claim 4, wherein the second semiconductor body comprises at least one multi quantum well structure which is optically pumped by the electromagnetic radiation generated in the first semiconductor body.

6. The light-emitting semiconductor component according to claim 1, wherein the first semiconductor body and the second semiconductor body have substantially the same optical refractive index.

7. The light-emitting semiconductor component according to claim 1, wherein the second semiconductor body is based on a material system AlGaIn and at least one element from the group comprising N, As, P.

8. The light-emitting semiconductor component according to claim 1, wherein the second semiconductor body has a thickness of at most 6 µm.

9. The light-emitting semiconductor component according to claim 1, wherein the second semiconductor body has a refractive index of at least 2.4.

10. The light-emitting semiconductor component according to claim 1, wherein the first semiconductor body and the second semiconductor body are produced separately from one another.

11. The light-emitting semiconductor component according to claim 1, which produces warm white light during operation.

12. The light-emitting semiconductor component according to claim 1, which produces cold white light during operation.

* * * * *